(12) United States Patent
Kojima

(10) Patent No.: US 11,217,688 B2
(45) Date of Patent: Jan. 4, 2022

(54) SEMICONDUCTOR DEVICE AND METHOD FOR MANUFACTURING SAME

(71) Applicants: KABUSHIKI KAISHA TOSHIBA, Minato-ku (JP); TOSHIBA ELECTRONIC DEVICES & STORAGE CORPORATION, Minato-ku (JP)

(72) Inventor: Hidenobu Kojima, Kanazawa (JP)

(73) Assignees: KABUSHIKI KAISHA TOSHIBA, Minato-ku (JP); TOSHIBA ELECTRONIC DEVICES & STORAGE CORPORATION, Minato-ku (JP)

( * ) Notice: Subject to any disclaimer, the term of this patent is extended or adjusted under 35 U.S.C. 154(b) by 23 days.

(21) Appl. No.: 16/808,584

(22) Filed: Mar. 4, 2020

(65) Prior Publication Data

US 2021/0074844 A1 Mar. 11, 2021

(30) Foreign Application Priority Data

Sep. 6, 2019 (JP) .............................. JP2019-163009

(51) Int. Cl.
| | | |
|---|---|---|
| *H01L 29/00* | (2006.01) | |
| *H01L 29/78* | (2006.01) | |
| *H01L 21/288* | (2006.01) | |
| *H01L 21/78* | (2006.01) | |

(52) U.S. Cl.
CPC ........ *H01L 29/7809* (2013.01); *H01L 21/288* (2013.01); *H01L 21/78* (2013.01); *H01L 29/7813* (2013.01); *H01L 29/7831* (2013.01)

(58) Field of Classification Search
None
See application file for complete search history.

(56) References Cited

U.S. PATENT DOCUMENTS

| | | | |
|---|---|---|---|
| 2008/0296611 A1 | 12/2008 | Kobayashi et al. | |
| 2018/0033694 A1 | 2/2018 | Ueno et al. | |
| 2019/0140091 A1* | 5/2019 | Kinoshita | ........... H01L 29/1608 |
| 2020/0119192 A1* | 4/2020 | Mitani | ................ H01L 29/1087 |

FOREIGN PATENT DOCUMENTS

| | | |
|---|---|---|
| JP | 2008-98529 A | 4/2008 |
| JP | 5483906 B2 | 5/2014 |
| JP | 5649322 B2 | 1/2015 |
| JP | 6332556 B2 | 5/2018 |

* cited by examiner

*Primary Examiner* — Reema Patel
(74) *Attorney, Agent, or Firm* — Oblon, McClelland, Maier & Neustadt, L.L.P.

(57) ABSTRACT

A semiconductor device includes a semiconductor part, a metal layer, first and second electrodes, and first and second control electrodes. The first and second electrodes are provided on a front surface of the semiconductor part and arranged along the front surface of the semiconductor part. The first control electrode is provided between the semiconductor part and the first electrode. The second control electrode is provided between the semiconductor part and the second electrode. The metal layer covers a back-surface of the semiconductor part. The metal layer includes a first layer and a second layer. The first layer of the metal layer is electrically connected to the semiconductor part. The second layer of the metal layer is provided on the first layer inside a periphery of the first layer. The second layer has a layer thickness thicker than a layer thickness of the first layer.

5 Claims, 6 Drawing Sheets

SEMICONDUCTOR DEVICE AND METHOD FOR MANUFACTURING SAME

CROSS-REFERENCE TO RELATED APPLICATIONS

This application is based upon and claims the benefit of priority from Japanese Patent Application No.2019-163009, filed on Sep. 6, 2019; the entire contents of which are incorporated herein by reference.

FIELD

Embodiments relate to a semiconductor device and a method of manufacturing the same.

BACKGROUND

A semiconductor device for power control is required to have a low on-resistance. For example, a semiconductor device has two electrodes on a front surface of a semiconductor layer, and controls the electric current flowing therebetween through the semiconductor layer by the MOS (Metal Oxide Semiconductor) gate structures. In such a semiconductor device, it is possible to reduce the on-resistance by providing a thick metal layer serving as a current path on the back-surface of the semiconductor layer. However, cutting off the semiconductor device chip from the wafer becomes harder as the metal layer on the back-surface is thicker.

DETAILED DESCRIPTION

Figure 1:
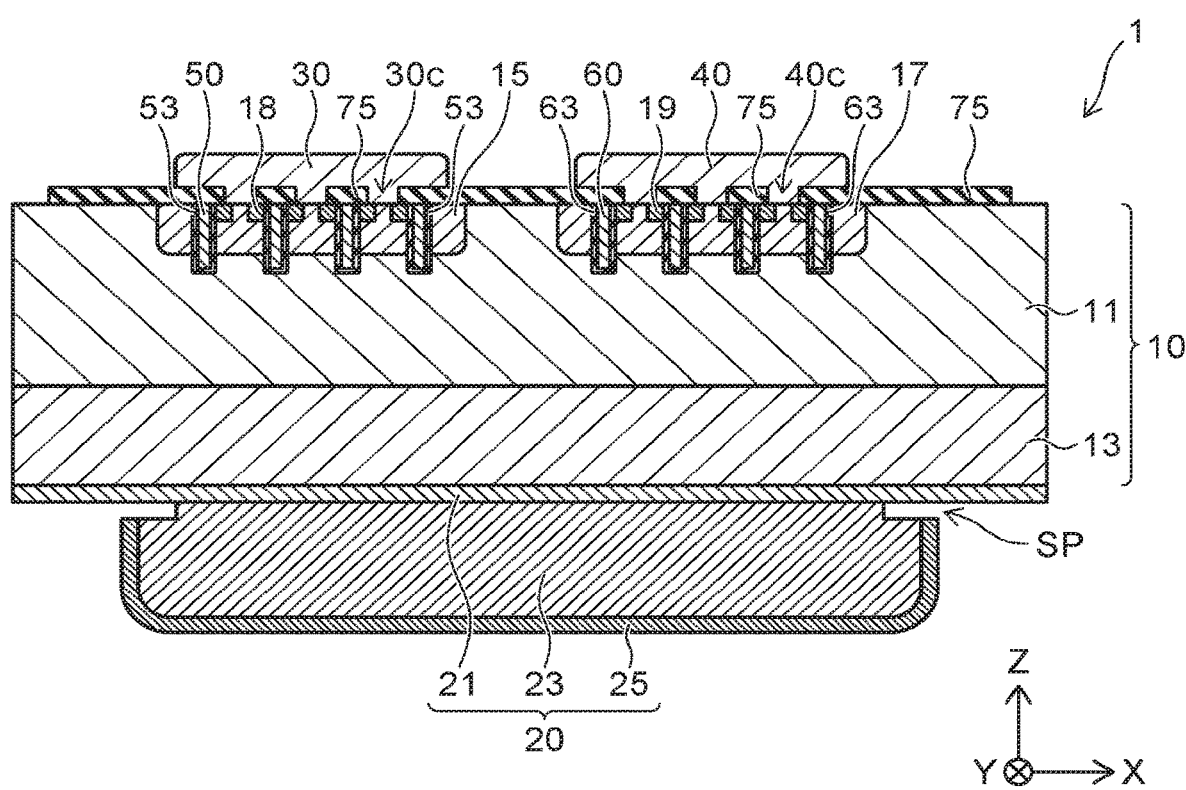
FIG. 1 is a schematic cross-sectional view showing a semiconductor device according to an embodiment.

According to one embodiment, a semiconductor device includes a semiconductor part, a metal layer, first and second electrodes, first and second control electrodes, and first to third insulating films. The metal layer covers a back surface of the semiconductor part. The first electrode is provided on a front surface of the semiconductor part. The second electrode provided on the front surface of the semiconductor part. The second electrode is spaced from the first electrode. The first control electrode is provided between the semiconductor part and the first electrode. The first insulating film is electrically isolating the first control electrode from the semiconductor part. The second control electrode is provided between the semiconductor part and the second electrode. The second insulating film is electrically isolating the second control electrode from the semiconductor part. The third insulating film is electrically isolating the first and second control electrodes from the first and second electrodes, respectively. The semiconductor part includes a first semiconductor layer of a first conductivity type, a second semiconductor layer of a second conductivity type, a third semiconductor layer of the first conductivity type, a fourth semiconductor layer of the second conductivity type and a fifth semiconductor layer of the first conductivity type. The first semiconductor layer includes a first portion and a second portion. The first portion of the first semiconductor layer is positioned between the metal layer and the first electrode. The second portion of the first semiconductor layer is positioned between the metal layer and the second electrode. The second semiconductor layer is provided between the first semiconductor layer and the first electrode. The second semiconductor layer is electrically connected to the first electrode. The second semiconductor layer faces the first control electrode with the first insulating film interposed. The third semiconductor layer is selectively provided between the second semiconductor layer and the first electrode. The third semiconductor layer is electrically connected to the first electrode. The fourth semiconductor layer is provided between the first semiconductor layer and the second electrode. The fourth semiconductor layer is electrically connected to the second electrode. The fourth semiconductor layer faces the second control electrode with the second insulating film interposed. The fifth semiconductor layer is selectively provided between the fourth semiconductor layer and the second electrode. The fourth semiconductor layer is electrically connected to the second electrode. The metal layer includes a first layer and a second layer. The first layer of the metal layer is electrically connected to the first semiconductor layer. The second layer is provided on the first layer inside a periphery of the first layer. The second layer has a layer thickness thicker than a layer thickness of the first layer. The second semiconductor layer is provided between the second layer of the metal layer and the first electrode. The fourth semiconductor layer is provided between the second layer of the metal layer and the second electrode.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

FIG. 1 is a schematic cross-sectional view showing a semiconductor device 1 according to the embodiment. The semiconductor device 1 includes a semiconductor part 10, a metal layer 20, a first electrode 30 and a second electrode 40. The semiconductor part 10 is, for example, silicon. The metal layer 20 is provided on a back-surface of the semiconductor part 10. The first electrode 30 and the second electrode 40 are provided on a front surface side of the semiconductor part 10 and arranged along the front surface. The first electrode 30 and the second electrode 40 are spaced from each other.

The semiconductor device 1 has the MOS gate structures provided respectively between the semiconductor part 10 and the first electrode 30 and between the semiconductor part 10 and the second electrode 40. For example, the gate electrodes 50 are provided between the semiconductor part 10 and the first electrode 30, and the gate electrodes 60 are provided between the semiconductor part 10 and the second electrode 40. The gate electrodes 50 and 60 each have a trench gate structure.

The gate electrode 50 is electrically insulated from the semiconductor part 10 by a gate insulating film 53. The gate electrode 60 is electrically insulated from the semiconductor part 10 by a gate insulating film 63. Moreover, the gate electrode 50 is electrically insulated from the first electrode 30 by an interlayer insulating film 75. The gate electrode 60 is electrically insulated from the second electrode 40 by the interlayer insulating film 75. The interlayer insulating film 75 includes a portion provided between the first electrode 30 and the gate electrode 50 and another portion provided between the second electrode 40 and the gate electrode 60. The gate insulating film 53, 63 and the interlayer insulating film 75 are, for example, silicon oxide film. It should be noted that the interlayer insulating film provided between the first electrode 30 and the gate electrode 50 may be different from the interlayer insulating film provided between the second electrode 40 and the gate electrode 60.

The semiconductor part 10 includes, for example, a first semiconductor layer (hereinafter, an n-type drift layer 11), a second semiconductor layer (hereinafter, a p-type diffusion layer 15), a third semiconductor layer (hereinafter, an n-type source layer 18), a fourth semiconductor layer (hereinafter, a p-type diffusion layer 17), a fifth semiconductor layer (herein after, an n-type source layer 19) and an n-type drain layer 13.

The n-type drift layer 11 is positioned between the metal layer 20 and the first electrode 30 and between the metal layer 20 and the second electrode 40.

The n-type drain layer 13 is positioned between the n-type drift layer 11 and the metal layer 20, and is electrically connected to the metal layer 20. The n-type drain layer 13 includes an n-type impurity with a concentration higher than a concentration of the n-type impurity in the n-type drift layer 11.

The p-type diffusion layer 15 is selectively provided between the n-type drift layer 11 and the first electrode 30. The p-type diffusion layer 15 is provided to face the gate electrode 50 with the gate insulating film 53 interposed.

The p-type diffusion layer 17 is selectively provided between the n-type drift layer 11 and the second electrode 40. The p-type diffusion layer 17 is provided to face the gate electrode 60 with the gate insulating film 63 interposed.

The n-type source layer 18 is selectively provided between the p-type diffusion layer 15 and the first electrode 30. The n-type source layer 18 includes an n-type impurity with a concentration higher than the concentration of the n-type impurity in the n-type drift layer 11. The n-type source layer 18 contacts the gate insulating film 53.

The n-type source layer 19 is selectively provided between the p-type diffusion layer 17 and the second electrode 40. The n-type source layer 19 includes an n-type impurity with a concentration higher than the concentration of the n-type impurity in the n-type drift layer 11. The n-type source layer 19 contacts the gate insulating film 63.

The first electrode 30 is electrically connected to the p-type diffusion layer 15 and the n-type source layer 18 via the contact portion 30c. The contact portion 30c is provided to extend through the interlayer insulating film 75, and contacts the semiconductor part 10.

The second electrode 40 is electrically connected to the p-type diffusion layer 17 and the n-type source layer 19 via the contact portion 40c. The contact portion 40c is provided to extend through the interlayer insulating film 75, and contacts the semiconductor part 10.

The metal layer 20 is provided to cover the back-surface of the semiconductor part 10. The metal layer 20 includes, for example, a first metal layer 21, a second metal layer 23 and a third metal layer 25. The first metal layer 21, the second metal layer 23 and the third metal layer 25 are stacked in order on the back surface of the semiconductor part 10.

The first metal layer 21 is electrically connected to the n-type drain layer 13. For example, the first metal layer 21 has a stacked structure which includes titanium (Ti), nickel (Ni) and silver (Ag) layers. For example, the Ti layer is in contact with the n-type drain layer 13 and electrically connected thereto. The Ni layer is provided between the Ti layer and the Ag layer.

The second metal layer 23 is selectively provided on the first metal layer 21. The second metal layer 23 is, for example, an Ag layer. The second metal layer 23 is thicker than the first metal layer 21 in the stacking direction of the metal layer 20 (i.e., in the Z-direction). For example, the first metal layer 21 has a thickness of 1 micrometer (μm) or less, and the second metal layer has a thickness of several dozen micrometers.

The second metal layer 23 is provided at a position opposite to the p-type diffusion layer 15 and the p-type diffusion layer 17 with the n-type drift layer 11 and the n-type drain layer 13 interposed. That is, the p-type diffusion layer 15 is provided between the second metal layer 23 and the first electrode 30. The p-type diffusion layer 17 is provided between the second metal layer 23 and the second electrode 40.

The third metal layer 25 is, for example, a Ni layer, and is provided to cover the second metal layer 23. The third metal layer 25 has a thickness of, for example, about 1 μm in the Z-direction. The third metal layer 23 protects the second metal layer 23 from ambient air. For example, the third metal layer prevents the Ag layer from sulfide corrosion and discoloration.

The metal layer 20 has, for example, a groove-shaped space SP between the first metal layer 21 and the second metal layer 23. The space SP is provided to extend along the periphery of the second metal layer 23.

Figure 2:
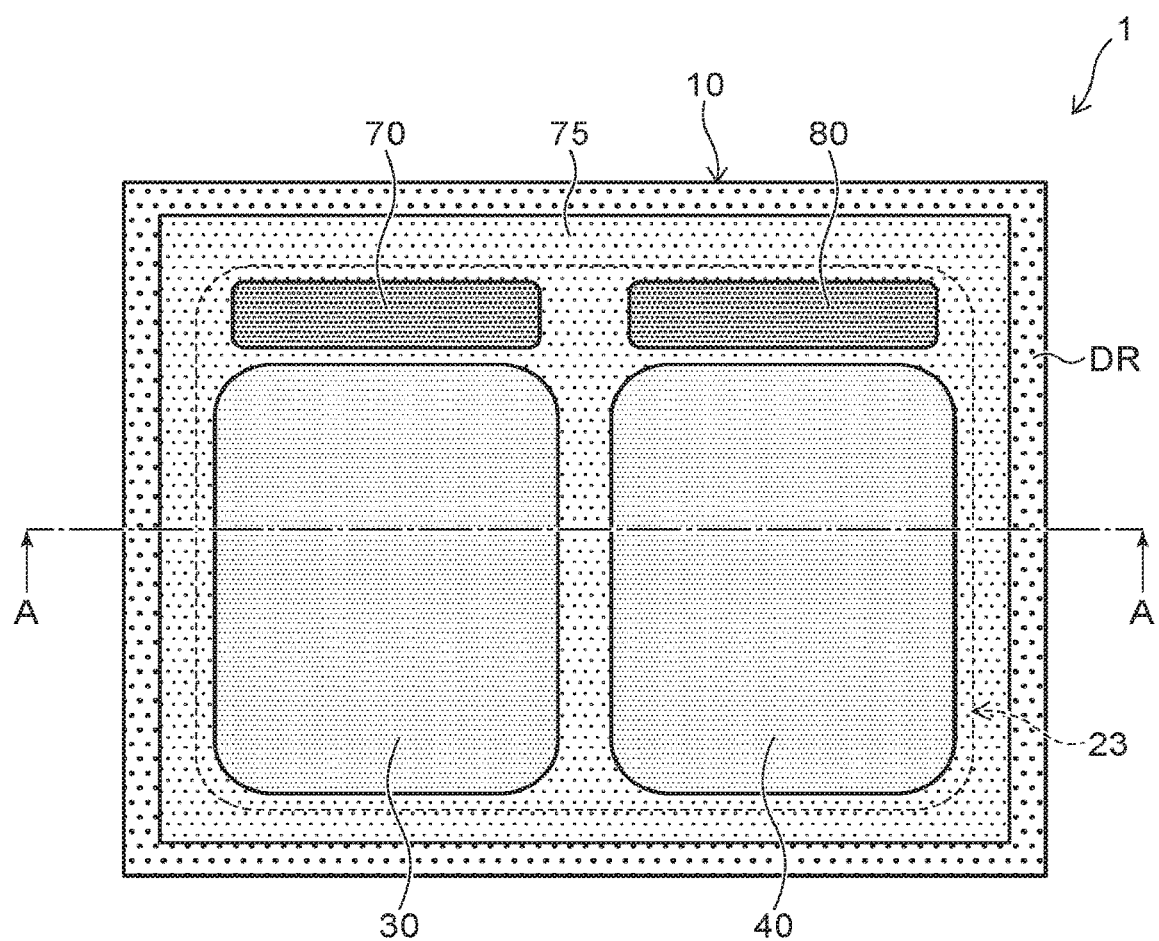
FIG. 2 is a schematic plan view showing the semiconductor device according to the embodiment.

FIG. 2 is a schematic plan view showing the semiconductor device 1 according to the embodiment. FIG. 2 is a schematic view showing the electrode arrangement at the front surface side of the semiconductor part 10. FIG. 1 is a cross sectional view taken along A-A line shown in FIG. 2.

As shown in FIG. 2, the first electrode 30 and the second electrode 40 are arranged in the X-direction, for example. The semiconductor device 1 further includes, for example, a gate pad 70 and a gate pad 80.

The gate pad 70 is provided to be spaced from the first electrode 30, the second electrode 40 and the gate pad 80. For example, the first electrode 30 and the gate pad 70 are arranged in the Y-direction. For example, the gate electrode 50 extends in the Y-direction between the semiconductor part 10 and the gate pad 70, and is electrically connected to the gate pad 70.

The gate pad 80 is provided to be spaced from the first electrode 30, the second electrode 40, and the gate pad 70. For example, the second electrode 40 and the gate pad 80 are arranged in the Y-direction. For example, the gate electrode 60 extends in the Y-direction between the semiconductor part 10 and the gate pad 80, and is electrically connected to the gate pad 80.

As shown in FIG. 2, the semiconductor device 1 has a dicing region DR along the periphery of the semiconductor part 10. The interlayer insulating film 75 covers the front surface of the semiconductor part 10 inside the dicing region DR. Moreover, the second metal layer 23 has a periphery inside the dicing region DR at the back-surface side of the semiconductor part 10.

Figure 3:
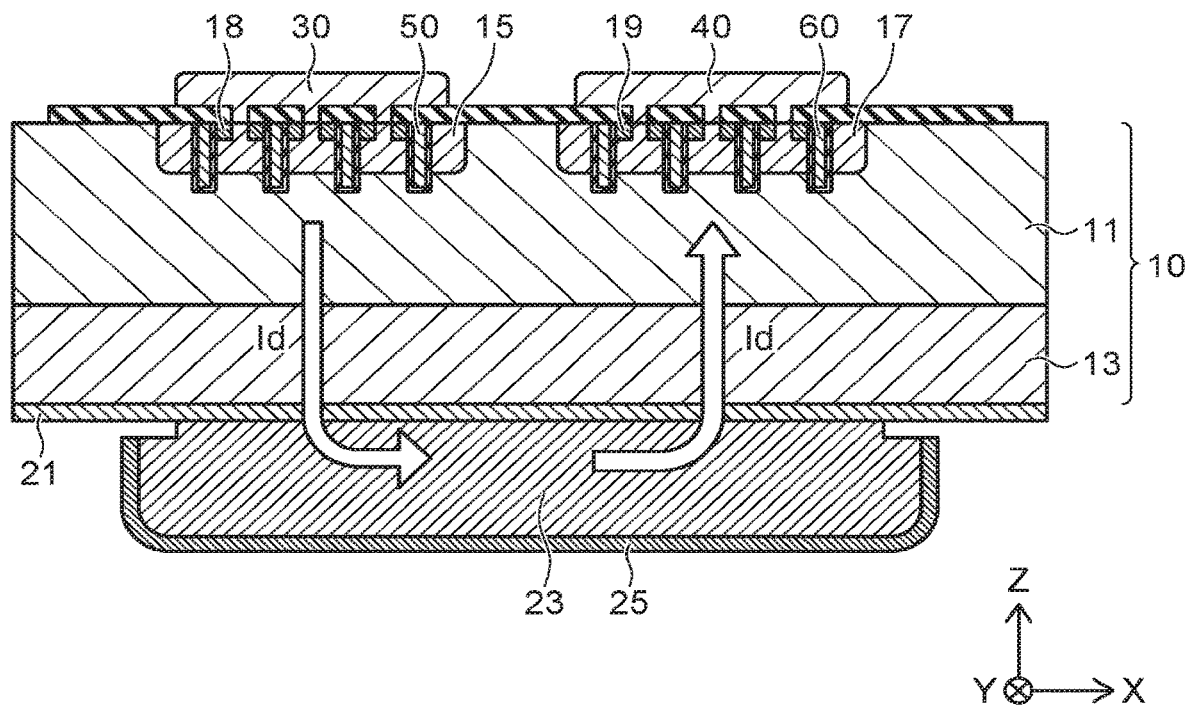
FIG. 3 is a schematic cross-sectional view showing the semiconductor device operation according to the embodiment.

FIG. 3 is a schematic cross-sectional view showing the operation of the semiconductor device 1 according to the embodiment. FIG. 3 is a schematic view showing the same cross section as in FIG. 1.

In the semiconductor device 1, the electric current Id flows, for example, from the first electrode 30 to the second electrode 40 due to the potential difference therebetween. The electric current Id flows under, for example, the switching-control by the gate electrodes 50 and 60.

When the metal layer 20 is provided on the back-surface of the semiconductor part 10, the electric current Id mainly flows from the first electrode 30 to the second electrode 40 through the metal layer 20 which provides a lower resistivity than the resistivity in the n-type drift layer 11 and the n-type drain layer 13. That is, it is possible in the semiconductor device 1 to reduce the on-resistance by making the current Id flow through the metal layer 20.

In the semiconductor device 1, the on-resistance is lower as the metal layer 20 is thicker. However, dividing the wafer into chips of semiconductor devices 1 becomes harder as the metal layer 20 is thicker. In the embodiment, the chips of the semiconductor devices 1 are easily formed by making in the metal layer 20 a thin region (e.g., the dicing region DR) and other thick region through which the electric current Id flows.

Hereinafter, with reference to FIGS. 4A to 5D, a method for manufacturing the semiconductor device 1 will be described. FIGS. 4A to 5D are schematic cross-sectional views showing the manufacturing process of the semiconductor device 1 according to the embodiment.

Figure 4A:
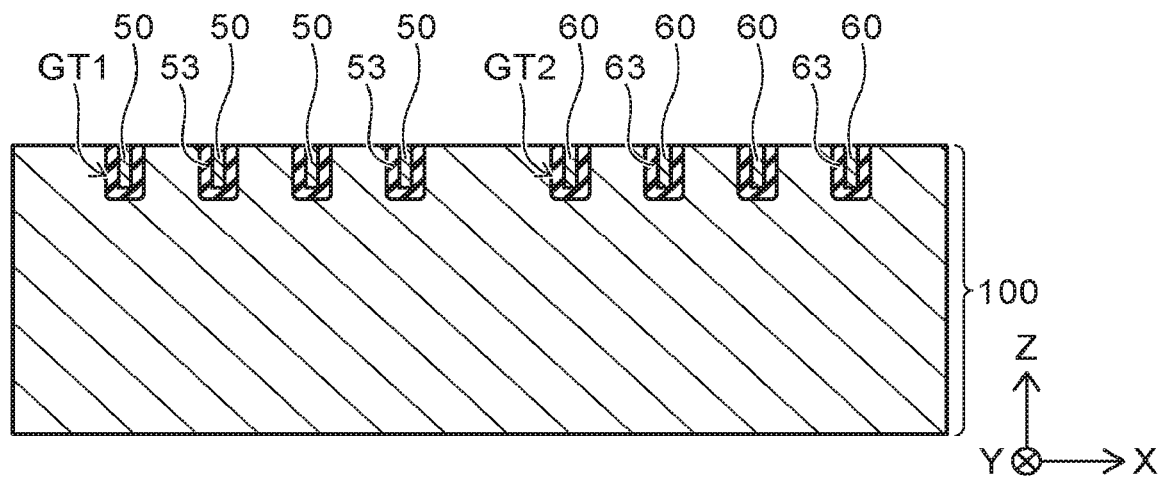
FIG. 4A to FIG. 5D are schematic cross-sectional views showing a manufacturing process of the semiconductor device according to the embodiment.

As shown in FIG. 4A, the gate electrodes 50 and 60 are formed at the front surface side of a wafer 100. The wafer 100 is a semiconductor wafer, for example, an n-type silicon wafer.

The gate electrodes 50 and 60 are provided respectively in gate trenches GT1 and GT2. The gate insulating films 53 and 63 are formed in the gate trenches GT1 and GT2, respectively. The gate insulating films 53 and 63 are, for example, silicon oxide films formed by thermal oxidization of silicon. The gate electrodes 50 and 60 are, for example, conductive polysilicon layers.

Figure 4B:
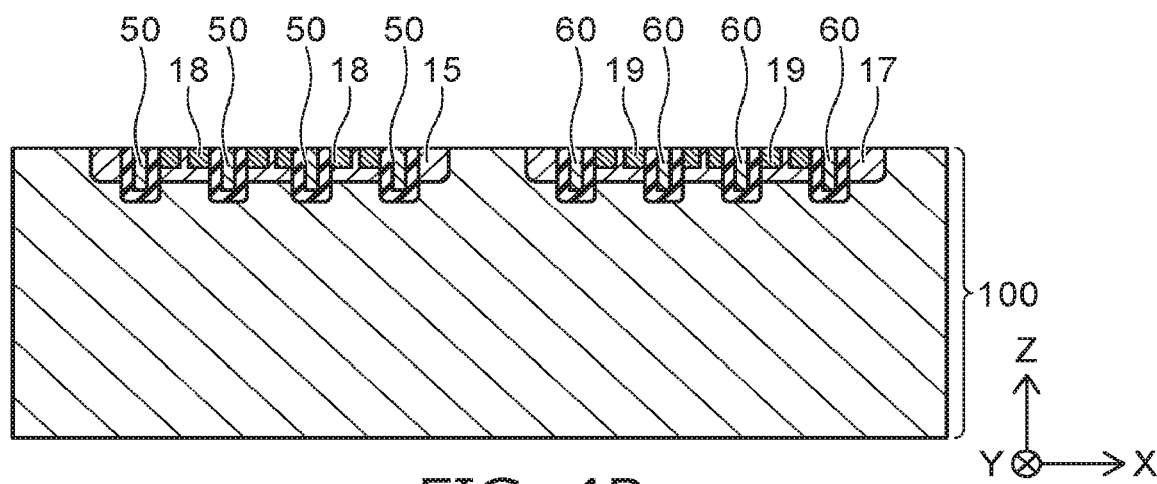

As shown in FIG. 4B, the p-type diffusion layer 15, the p-type diffusion layer 17, the n-type source layers 18 and 19 are formed at the front surface side of the wafer 100.

The p-type diffusion layer 15 and 17 are formed by, for example, selectively ion-implanting p-type impurities and then, by heat-treating the wafer 100. The p-type impurity is, for example, boron (B).

The n-type source layers 18 and 19 are formed by, for example, selectively ion-implanting n-type impurities and then, by heat-treating the wafer 100. The n-type impurity is, for example, phosphorus (P).

Figure 4C:
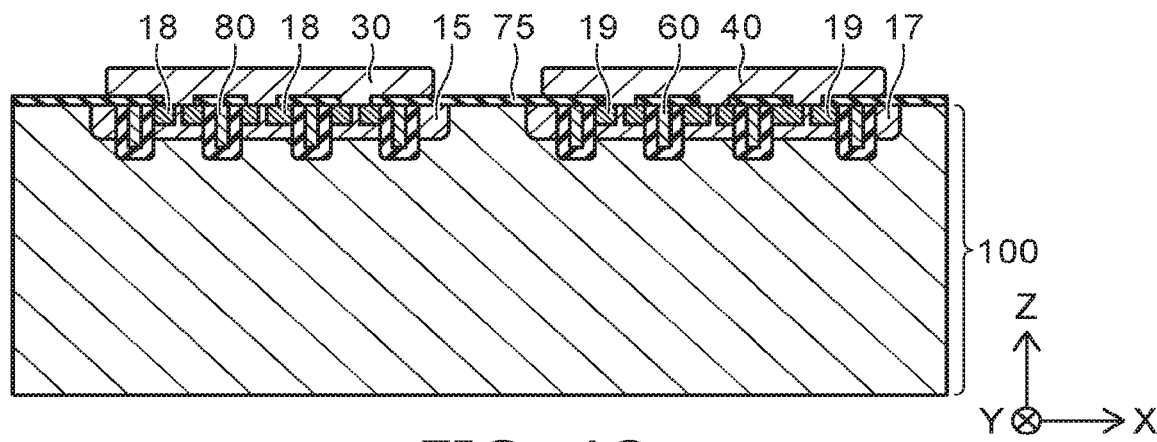

As shown in FIG. 4C, the first electrode 30 and the second electrode 40 are formed at the front surface side of the wafer 100 after the interlayer insulating film 75 is formed on the front surface. The first electrode 30 is electrically connected to the p-type diffusion layers 15 and the n-type source layers 18 through the contact openings formed in the interlayer insulating film 75. The second electrode 40 is electrically connected to the p-type diffusion layers 17 and the n-type source layers 19 through the contact holes formed in the interlayer insulating film 75.

The interlayer insulating film 75 is a silicon oxide film formed by, for example, CVD (Chemical Vapor Deposition). The first electrode 30 and the second electrode 40 are metal layers including, for example, tungsten (W) and aluminum (Al).

Figure 5A:
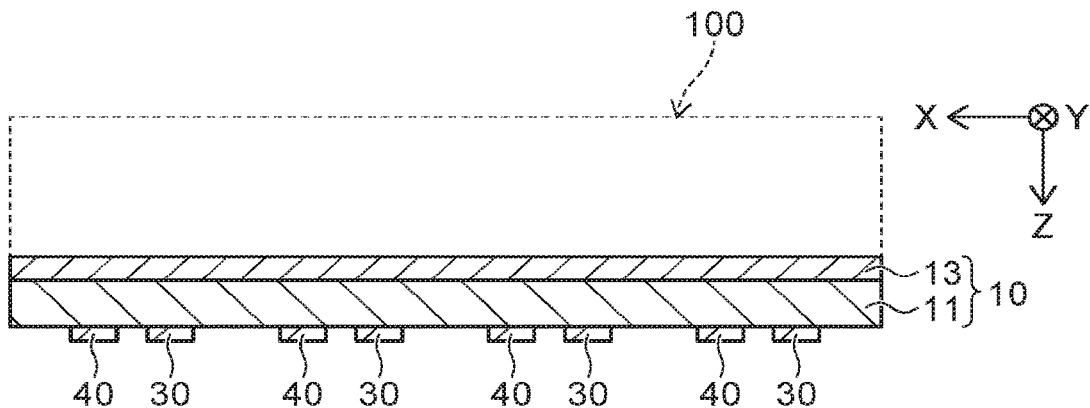
Figure 5B:
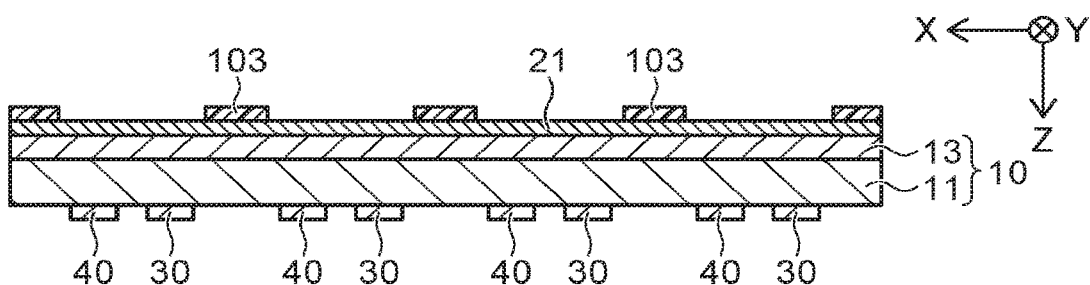
Figure 5C:
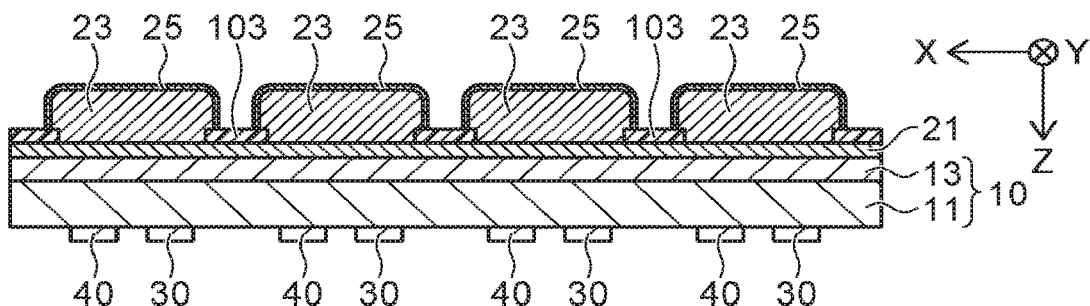

As shown in FIG. 5A, the wafer 100 is thinned by grinding or etching at the back-surface side of the wafer 100. Moreover, an n-type impurity such as phosphorus (P) is ion-implanted through the back-surface of the thinned wafer 100 to form the n-type drain layer 13. The n-type drift layer 11 (see FIG. 1) is formed between the n-type drain layer 13 and the p-type diffusion layer 17. Hereinafter, the thinned wafer 100 is referred to as the semiconductor part 10. In FIGS. 5A to 5C, MOS gate structures are omitted for convenience in illustration.

As shown in FIG. 5B, a mask 103 for metal plating is formed on the first metal layer 21 after the first metal layer 21 is formed on the back-surface of the semiconductor part 10. The first metal layer 21 includes, for example, a Ti layer, a Ni layer, and an Ag layer that are sequentially stacked using a sputtering method. There may be a case where the Ni layer is omitted.

The mask 103 is, for example, a resist film that is patterned into a predetermined shape using photolithography. The mask 103 is formed to extend along, for example, the dicing region DR (see FIG. 2) at the front surface side of the semiconductor part 10. The mask 103 is formed to cover a portion not serving as the pathway for the electric current Id flowing from the first electrode 30 to the second electrode 40. For example, the mask 103 has a thickness of several micrometers in the Z-direction.

As shown in FIG. 5C, the second metal layer 23 and the third metal layer 25 are selectively formed on the first metal layer 21.

The second metal layer 23 is, for example, an Ag layer, and is formed by an electroplating method using the first metal layer 21 as a seed layer. The second metal layer 23 is formed to have a thickness in the Z-direction of, for example, 30 to 40 μm. Moreover, the second metal layer 23 is formed such that the periphery thereof overhangs the mask 103.

The third metal layer 25 is, for example, a Ni layer which is formed using an electroplating method. The third metal layer 25 is formed on the second metal layer 23 so that the whole surface thereof exposed at the back-surface side of the semiconductor part 10 is covered. The second metal layer 23 and the third metal layer 25 are, for example, continuously formed by using the electroplating method.

Figure 5D:
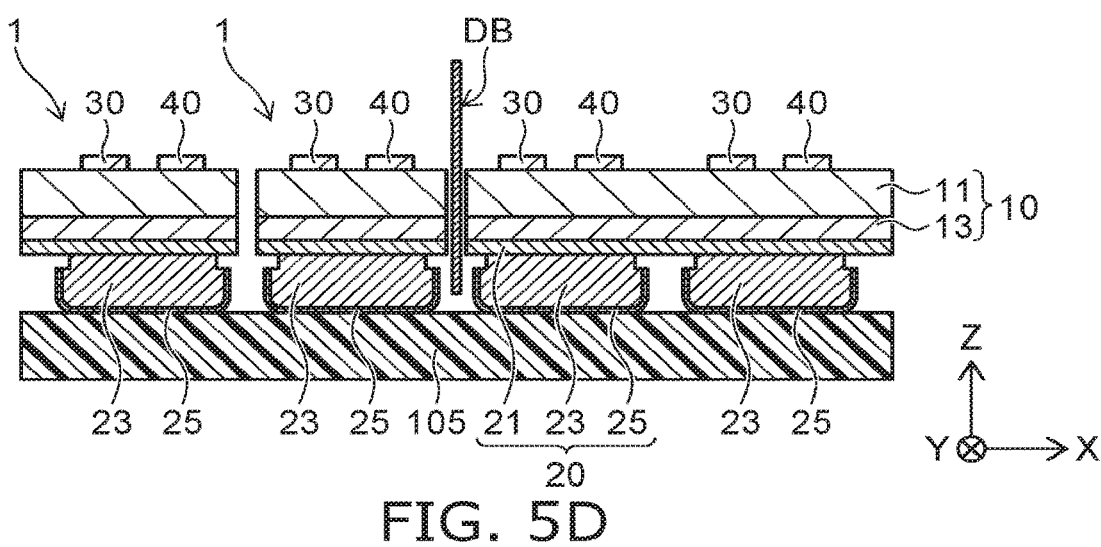

As shown in FIG. 5D, after the mask 103 is removed, a dicing sheet 105 is attached to the back side of the semiconductor part 10 on which the metal layer 20 is formed. Subsequently, the semiconductor part 10 held on the dicing sheet 105 is cut into the chips of the semiconductor devices 1.

The groove-shaped space SP (see FIG. 1) is formed between the first metal layer 21 and the overhanging portion of the second metal layer 23 by removing the mask 103. The space SP extends along the periphery of the second metal layer 23.

The semiconductor device 1 is formed into a chip by cutting off the semiconductor part 10 and the metal layer 20 using, for example, a dicing blade DB. When cutting off the thick metal layer 20 by the dicing blade DB, the blade clogging occurs and deteriorates cutting quality. Moreover, the cutting burr may remain at the chip edge, making a failure when picking up or mounting the chip. In the manufacturing method according to the embodiment, the dicing region DR (see FIG. 2) is provided without the thick second metal layer 23. Therefore, in the dicing process of the semiconductor device 1, the semiconductor part 10 is divided into the chips at the dicing region DR on which the thin first metal layer 21 is provided without the second metal layer 23. Thereby, the semiconductor device 1 is easily formed into the chip, and improves the manufacturing yield in the chip assembly process.

Figure 6:
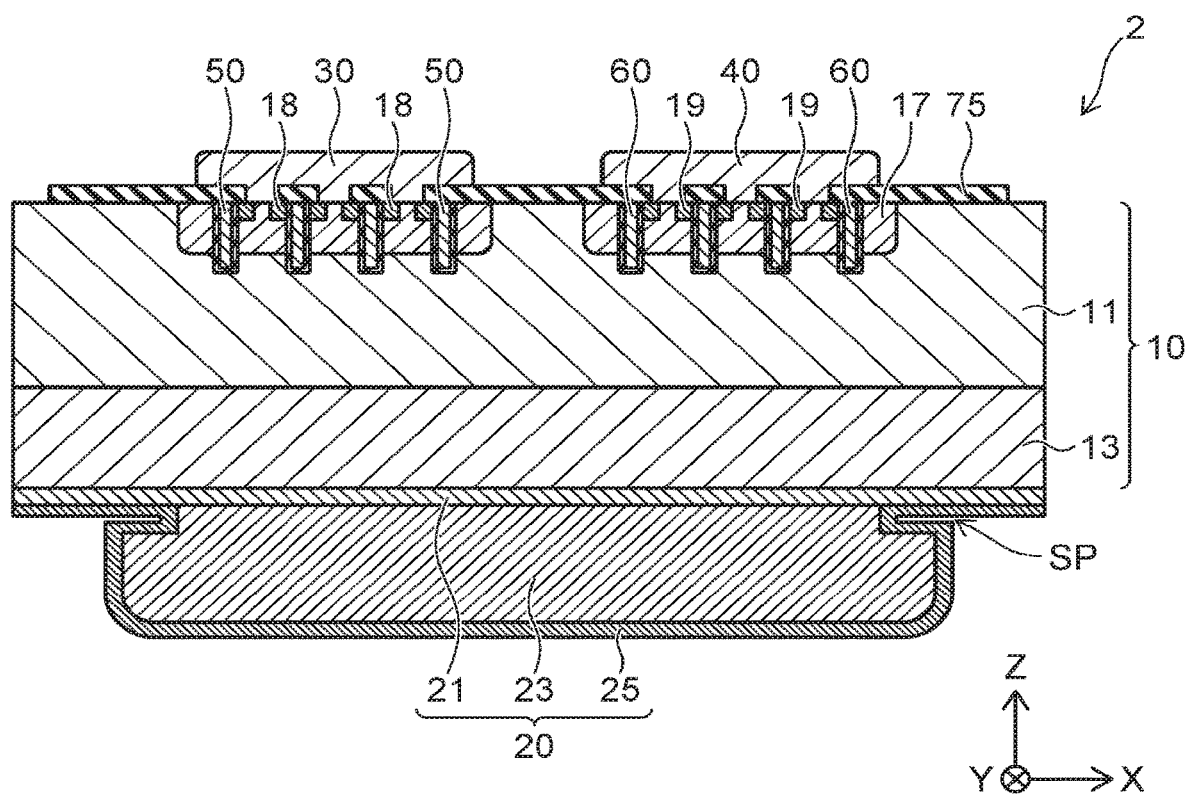
FIG. 6 is a schematic cross-sectional view showing a semiconductor device according to a modification of the embodiment.

FIG. 6 is a schematic cross-sectional view showing a semiconductor device 2 according to a modification of the embodiment. The semiconductor device 2 includes the semiconductor part 10, the metal layer 20, the first electrode 30, and the second electrode 40. The semiconductor device 2 also has the MOS gate structures that are provided respectively between the semiconductor part 10 and the first electrode 30 and between the semiconductor part 10 and the second electrode 40.

The metal layer 20 includes the first metal layer 21, the second metal layer 23, and the third metal layer 25. In this example, the third metal layer 25 is formed to cover the first metal layer 21 and the second metal layer 23.

In the manufacturing process of the semiconductor device 2, the mask 103 for metal plating is removed after the second metal layer 23 is formed and before the third metal layer 25 is formed. Then, the Ni layer is plated on the entire exposed-surfaces of the first metal layer 21 and the second metal layer 23 at the back-surface side of the semiconductor part 10. Thereby, the Ni layer is also formed in the space SP between the first metal layer 21 and the overhanging portion of the second metal layer 23. There may be a case where the space SP is filled with the Ni layer.

In the semiconductor device 2, the third metal layer 25 may protect both the first metal layer 21 and the second metal layer 23 from ambient air.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:

a semiconductor part;

a metal layer covering a back-surface of the semiconductor part;

a first electrode provided on a front surface of the semiconductor part;

a second electrode provided on the front surface of the semiconductor part, the second electrode being spaced from the first electrode;

a first control electrode provided between the semiconductor part and the first electrode;

a first insulating film electrically isolating the first control electrode from the semiconductor part;

a second control electrode provided between the semiconductor part and the second electrode;

a second insulating film electrically isolating the second control electrode from the semiconductor part; and a third insulating film electrically isolating the first and second control electrodes from the first and second electrodes, respectively, the semiconductor part including a first semiconductor layer of a first conductivity type, a second semiconductor layer of a second conductivity type, a third semiconductor layer of the first conductivity type, a fourth semiconductor layer of the second conductivity type and a fifth semiconductor layer of the first conductivity type, the first semiconductor layer including a first portion and a second portion, the first portion being positioned between the metal layer and the first electrode, the second portion being positioned between the metal layer and the second electrode, the second semiconductor layer provided between the first semiconductor layer and the first electrode, the second semiconductor layer being electrically connected to the first electrode, the second semiconductor layer facing the first control electrode with the first insulating film interposed, the third semiconductor layer selectively provided between the second semiconductor layer and the first electrode, the third semiconductor layer being electrically connected to the first electrode, the fourth semiconductor layer provided between the first semiconductor layer and the second electrode, the fourth semiconductor layer being electrically connected to the second electrode, the fourth semiconductor layer facing the second control electrode with the second insulating film interposed, the fifth semiconductor layer selectively provided between the fourth semiconductor layer and the second electrode, the fifth semiconductor layer being electrically connected to the second electrode, the metal layer including a first layer and a second layer, the first layer being electrically connected to the first semiconductor layer, the second layer being provided on the first layer inside a periphery of the first layer, the second layer having a layer thickness thicker than a layer thickness of the first layer, the second semiconductor layer being provided between the second layer of the metal layer and the first electrode, the fourth semiconductor layer being provided between the second layer of the metal layer and the second electrode.

2. The device according to claim 1, wherein the metal layer includes a space extending along a periphery of the second layer, the space being provided between the first layer and an overhanging portion of the second layer.

3. The device according to claim 1, wherein the metal layer further includes a third layer covering the second layer, the third layer having a layer thickness thinner than the layer thickness of the second layer.

4. The device according to claim 1, wherein the metal layer further includes a third layer covering the first layer and the second layer, the third layer having a layer thickness thinner than the layer thickness of the second layer.

5. The device according to claim 3, wherein
the first layer and the second layer of the metal layer includes silver, and the third layer includes nickel.

\* \* \* \* \*